US012689290B2

(12) United States Patent (10) Patent No.: US 12,689,290 B2

Aaltonen (45) Date of Patent: Jul. 21, 2026

(54) REDUNDANT ON-CHIP HIGH VOLTAGE GENERATION

(71) Applicant: Murata Manufacturing Co., Ltd., Nagaokakyo (JP)

(72) Inventor: Lasse Aaltonen, Espoo (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 33 days.

(21) Appl. No.: 19/011,007

(22) Filed: Jan. 6, 2025

(65) Prior Publication Data

US 2025/0226743 A1　Jul. 10, 2025

(30) Foreign Application Priority Data

Jan. 10, 2024　(EP) ..................................... 24151094

(51) Int. Cl.
　*H02M 3/07*　(2006.01)
　*G01R 31/3177*　(2006.01)
　*G01R 31/40*　(2020.01)
　*H02M 1/00*　(2006.01)

(52) U.S. Cl.
　CPC .......... *H02M 3/07* (2013.01); *G01R 31/3177* (2013.01); *G01R 31/40* (2013.01); *H02M 1/0012* (2021.05)

(58) Field of Classification Search
　CPC ...... H02M 3/07; H02M 1/0012; H02M 1/325; H02M 1/36; G01R 31/3177; G01R 31/40
　See application file for complete search history.

(56) References Cited

U.S. PATENT DOCUMENTS

| | | | |
|---|---|---|---|
| 11,139,726 B2 | 10/2021 | Copeland, Jr. | |
| 2012/0154022 A1 | 6/2012 | Cazzaniga et al. | |
| 2014/0029346 A1* | 1/2014 | Tanzawa | G06F 1/32 |
| | | | 324/762.01 |
| 2014/0218082 A1* | 8/2014 | Fan | H03L 7/0893 |
| | | | 327/552 |
| 2016/0285362 A1* | 9/2016 | Pillonnet | H02M 1/32 |
| 2019/0268006 A1* | 8/2019 | Hiraku | H03L 7/1075 |
| 2022/0115948 A1* | 4/2022 | Chang | G11C 16/32 |

OTHER PUBLICATIONS

Aaltonen et al., "On-Chip Charge-Pump with Continuous Frequency Regulation for Precision High-Voltage Generation", In: Proceedings of the 2009 Ph.D. Research in Microelectronics and Electronics (PRIME 2009), Cork, Ireland. 1217, ISBN 9781424437320, Jul. 2009, pp. 68-71.

* cited by examiner

*Primary Examiner* — Sibin Chen

(74) *Attorney, Agent, or Firm* — ArentFox Schiff LLP

(57) ABSTRACT

An auto-redundant high voltage generating circuitry and a method to generate a high voltage to a low DC current load is provided. The circuitry incudes a digital controller and two charge pump modules each comprising a charge pump. The high voltage is generated by having either one of the two charge pump modules active at a time. Each charge pump module is configured to have its output in a high impedance state whenever the respective charge pump module is inactive, and to provide a status information signal that indicates whether the active charge pump module is functional. The digital controller monitors the active charge pump module's status information signal, and automatically switches to the other charge pump module to produce the high voltage if the status information signal indicates that the currently active charge pump module is not functional.

20 Claims, 6 Drawing Sheets

REDUNDANT ON-CHIP HIGH VOLTAGE GENERATION

CROSS REFERENCE TO RELATED APPLICATIONS

The application claims priority to European Patent Application No. 24151094.0, filed Jan. 10, 2024, the entire contents of which are hereby incorporated by reference.

TECHNICAL FIELD

The present disclosure relates to high voltage generation, and, more particularly, to redundant on-chip high voltage generation. The present disclosure further relates to an integrated auto-redundant high voltage generation circuitry and a method of operating the integrated auto-redundant high voltage generation circuitry.

BACKGROUND

Currently, a charge pump is known that includes circuitry that generates a high voltage from a given power supply voltage. This configuration is a type of DC-to-DC converter. In this context, the term high voltage refers to an output voltage of a charge pump that is generated from an input voltage, such as a power supply voltage, that is lower than the high voltage. Generally, charge pumps operate on the principle of transferring electric charge from one capacitor to another.

Integrated high voltage generation, especially when load current is in range of tens of microamperes, is preferably implemented using charge pumps instead of using DC-to-DC converters that require inductors, which typically cannot be integrated in a semiconductor chip. It is also noted that the term integrated refers to implementing high voltage generating circuitry within an integrated circuit, such as an ASIC. The charge pump (CP) allows an input voltage, such as a power supply voltage, to be charged to a capacitor top plate, while the capacitor bottom plate is initially at ground voltage. The basic principle of an ideal charge pump is that when the bottom plate is lifted to a voltage determined by the input voltage, the voltage of the top plate rises to a voltage corresponding to the input voltage plus the voltage associated with the previously input charge. When there's any resistive load connected to the capacitor, the voltage across the capacitor will rapidly drop. This is the reason why capacitors are rather large in charge pumps, and voltage refresh rates are rather high.

The required amount of charge pump capacitance increases also because there is often more than one charge pump stage needed to achieve even higher output voltage. This is due to fact that typically the voltage increment per pump stage is determined by the available input voltage, while an output load current is flowing through every pump stage, the achievable voltage increase per pump stage is considerably smaller than the full input voltage. The number of pump stages, size of the capacitor, and the frequency of operation, also referred to as a refresh rate, is an optimization problem between ASIC area and supply current or efficiency. What is important for the purpose of this disclosure is that required amount of capacitance connected to high voltage, which is higher than the supply voltage can be several pikofarads (pF). In a typical integrated circuit device, such as an ASIC device, the supply voltage is 5 V, and which case the high voltage is more than 5 V. Digital signals within the normal supply voltage range, typically between 0V and 5V are referred to as low voltage, LV, signals and circuitry configured to operate with low voltage signals is referred to as low voltage circuitry.

Charge pump high voltage capacitances are typically implemented in using interconnection metal layers of the ASIC, with a layout in form of fingered structures, i.e. two interlaced combs. However, in a typical ASIC chip, needed finger length for a 1 pF capacitor is around 10 mm. When adjacent fingers are spaced with minimum distance in between fingers to maximize the capacitance, high voltage capacitances become very critical from process quality perspective. Since a single, less than 1 μm local imperfection between fingers of the two interlaced combs of the capacitor can cause short-circuiting the fingers and thus the capacitor, which causes the charge pump to completely fail, also the latent process quality becomes a matter of importance. It is possible to screen faulty capacitors by exposing the capacitors for example to a controlled over-voltage or stress-voltage. However, charge pump structures do not typically directly support this as adjacent pump stages are separated from each other with diodes or transistors. Special techniques are then required to allow all capacitors of the charge pump to receive an equal stress-voltage for testing. These special techniques tend to increase circuit area, and require special, often very costly, high temperature, high voltage screening processes.

An article titled "On-chip charge pump with continuous frequency regulation for precision high voltage generation." (Proceedings of the 2009 Ph.D. Research in Microelectronics and Electronics (PRIME 2009); Cork, Ireland. 12-17 Jul. 2009. Pages 68-71. ISBN 978-1-4244-3732-0." By L. Aaltonen and K. Halonen) discloses an on-chip charge pump for high voltage generation.

In this disclosure, FIG. 1 illustrates an example of a regulated charge pump circuitry with a voltage-controlled oscillator ("VCO").

In this regulated charge pump circuitry, a feedback control loop controlling operation of the charge pump (CP) 30 is implemented essentially in continuous time in effort to minimize low-frequency ripple in the high voltage (HV) at the CP output in response to active regulation. The CP 30 may be implemented as any known type of charge pump, for example a Dickson-type pump. The CP receives at its input a supply voltage ($V_{DD}$) and provides at its output the wanted high voltage HV. A voltage divider 31 divides the high voltage HV and provides a divided high voltage (DHV) as an input to a controller circuitry (P-CTRL) 32. Voltage division by the voltage divider 31 enables using voltages in the control loop, such as the DHV to reside within normal supply voltage range. As a simple example, the voltage divider 31 may be a resistive divider with two or more resistors connected in series. A high resistance of the voltage divider 31 is beneficial, since a high load resistance at the output of the charge pump facilitates a small current, and thus small additional load to the charge pump due to the control loop. This type of charge pump is optimally designed to feed a low DC current load, which is typically a primarily capacitive load. A DC current load may be due to for example resistive load in range from few hundred kΩ to several MΩ or current mode load due to active high voltage blocks in range from few μA to several tens of μA.

Preferably, current in the control loop should only be a minor share of the total load current of the charge pump so that majority of the load current can be provided to a low DC current load coupled to the HV. Selection of the size of the resistances in the voltage divider 31 is a design parameter that depends for example on whether the charge pump is entirely integrated, or the charge pump is provided with external capacitors. Requirement of the external load current is a key design parameter of the circuitry. Design of the voltage divider is further a trade-off between area required by the resistors and area required by the charge pump, since the voltage divider causes additional load current for the charge pump. Large resistors facilitate small additional load current and thus allows a smaller charge pump with less circuit area, but on the other hand, large resistors also require a great circuit area. The controller circuitry 32 compares the divided high voltage DHV with a voltage reference voltage VREF. Difference between the divided high voltage DHV and the reference voltage VREF is fed to a voltage-controlled oscillator, VCO, 33. Difference voltage adjusts operating frequency of the VCO 33, which controls pumping frequency of the charge pump by providing two clock signals CK in mutually opposite phases for the HV CP.

Other possible charge pump implementations that may be used in connection with the disclosure are disclosed in the U.S. Pat. No. 11,139,726 B2, the contents of which are hereby incorporated by reference.

However, a problem is to find a solution for providing a reliable, integrated high voltage source without extensively increasing circuit area of the integrated circuitry for enabling testing proper operation the of integrated high voltage generating circuitry.

SUMMARY OF THE INVENTION

In view of the foregoing, an object of the present disclosure provides a duplicated, auto-redundant charge pump circuitry and a method of operating the duplicated, auto-redundant charge pump circuitry.

According to a first aspect, an auto-redundant high voltage generating circuitry for generating a high voltage to a low DC current load is provided. The auto-redundant high voltage generating circuitry comprises a digital controller and two charge pump modules each comprising a charge pump, CP. The high voltage is configured to be generated by having either one of the two charge pump modules active at a time, while the other one of the two charge pump module is inactive. Each charge pump module is configured to have its output in a high impedance state whenever the respective charge pump module is inactive, and to provide a status information signal that indicates whether the active charge pump module is functional. The digital controller is configured to monitor the active charge pump module's status information signal, and to automatically switch to the other charge pump module to produce the high voltage if the status information signal indicates that the currently active charge pump module is not functional.

According to another exemplary embodiment, the status information signal that indicates whether the active charge pump module is functional is determined based on comparing a divided voltage to a reference voltage. The divided voltage is generated by dividing the high voltage at the output of the charge pump module with a resistive divider.

According to another exemplary embodiment, the digital controller comprises a delay chain configured to delay automatic switching of the output voltage of the charge pump of a newly activated charge pump module to the high voltage output of the high voltage generating circuitry for a delay period, to enable the output voltage of the newly activated charge pump to reach a predetermined high voltage value before said automatic switching.

According to another exemplary embodiment, each charge pump module or each charge pump comprises a dedicated voltage-controlled oscillator configured to generate clock signals for operating the charge pump of the respective charge pump module.

According to another exemplary embodiment, the auto-redundant high voltage generating circuitry comprises a single voltage-controlled oscillator configured to generate clock signals for operating one charge pump of the two charge pump modules at a time.

According to another exemplary embodiment, a reference clock signal for the delay chain is generated by the shared voltage-controlled oscillator.

According to another exemplary embodiment, a reference clock signal for the delay chain is received from an external reference clock generation circuitry.

According to another exemplary embodiment, the digital controller is configured to test proper operation of each individual charge pump module by i) disabling auto-redundancy between the two charge pump modules, ii) forcing one of the two charge pump modules to be active, and iii) determining whether the high voltage received from the active charge pump module is in predetermined level by comparing a divided voltage to a/the reference voltage. The divided voltage is generated by dividing the high voltage at the output of the charge pump module with a resistive divider.

According to another exemplary embodiment, the digital controller is configured to test proper operation of a switching logic of the digital controller by a) forcing the output of a charge pump of a first one of the two charge pump modules to a failure condition by causing output of the charge pump comprised in the active charge pump module to be short circuited to ground, and b) detecting whether the second charge pump module of the two charge pump modules activates within a predetermined delay after the output of the charge pump of the first one of the two charge pump modules was forced to the failure condition.

According to a second exemplary aspect, a method for generating a high voltage to a low DC current load by an auto-redundant charge pump circuitry is provided. The auto-redundant charge pump circuitry comprises a digital controller and two charge pump modules each comprising a charge pump. The method comprises generating the high voltage by an active charge pump module, while the other one of the two charge pump module is inactive. The method comprises setting output of a charge pump module in a high impedance state whenever the respective charge pump module is inactive, providing, by the active charge pump module, a status information signal that indicates whether the active charge pump module is functional, monitoring, by the digital controller, the active charge pump module's status information signal, and automatically switching the other charge pump module to produce the high voltage if the status information signal indicates that the currently active charge pump module is not functional.

According to another exemplary embodiment, the method comprises determining the status information signal that indicates whether the active charge pump module is functional based on comparing a divided voltage to a reference voltage. The divided voltage is generated by dividing the high voltage at the output of the charge pump module with a resistive divider.

According to another exemplary embodiment, the method further comprises delaying automatic switching of the output voltage of the charge pump of a newly activated charge pump module to the high voltage output of the high voltage generating circuitry for a delay period to enable the output voltage of the newly activated charge pump to reach a predetermined high voltage value before said automatic switching.

According to another exemplary embodiment, the method further comprises generating a clock signal for operating the charge pump of the respective charge pump module by a dedicated voltage-controlled oscillator comprised in the respective charge pump module.

According to another exemplary embodiment, the method further comprises generating a clock signal for operating one charge pump of the two charge pump modules at a time by a single, shared voltage-controlled oscillator.

According to another exemplary embodiment, the method further comprises generating a reference clock signal for determining amount of said delaying of automatic switching by the shared voltage-controlled oscillator.

According to another exemplary embodiment, the method further comprises receiving a reference clock signal for determining amount of delaying of said automatic switching from an external reference clock generation circuitry.

According to another exemplary embodiment, the method further comprises testing proper operation of each individual charge pump module by i) disabling auto-redundancy between the two charge pump modules, ii) forcing one of the two charge pump modules to be active, and iii) determining whether the high voltage received from the active charge pump module is in predetermined level by comparing a divided voltage to a/the reference voltage. The divided voltage is generated by dividing the high voltage at the output of the charge pump module with a/the resistive divider.

According to another exemplary embodiment, the method further comprises testing proper operation of a switching logic by a) forcing the output of a charge pump of a first one of the two charge pump modules to a failure condition by causing output of the charge pump comprised in the active charge pump module to be short circuited to ground, and b) detecting whether the second charge pump module of the two charge pump modules activates within a predetermined delay after the output of the charge pump of the first one of the two charge pump modules was forced to the failure condition.

The exemplary aspects of the present disclosure are based on the idea of providing an auto-redundant high voltage source, which comprises two charge pump circuitries and control circuitry to enable and control the auto-redundant operation thereof. Although the solution does not enable extensive testing of the charge pump circuitries as such, redundancy significantly reduces the likelihood of total failure of the high voltage generation operation.

An advantage of the auto-redundant charge pump arrangement and method of the disclosure is that extensive screening of operation of the charge pump itself can be avoided. The solution is technically feasible when the charge pump circuitry is sufficiently small so that the solution does not unnecessarily increase circuit area of the integrated circuit.

BRIEF DESCRIPTION OF THE DRAWINGS

In the following, the disclosure will be described in greater detail by exemplary embodiments with reference to the accompanying drawings, in which.

It is noted that the figures are for illustrative purposes only and are not shown in scale.

DETAILED DESCRIPTION

The exemplary aspects of the present disclosure relate to high voltage generation using charge pumps.

Figure 1:
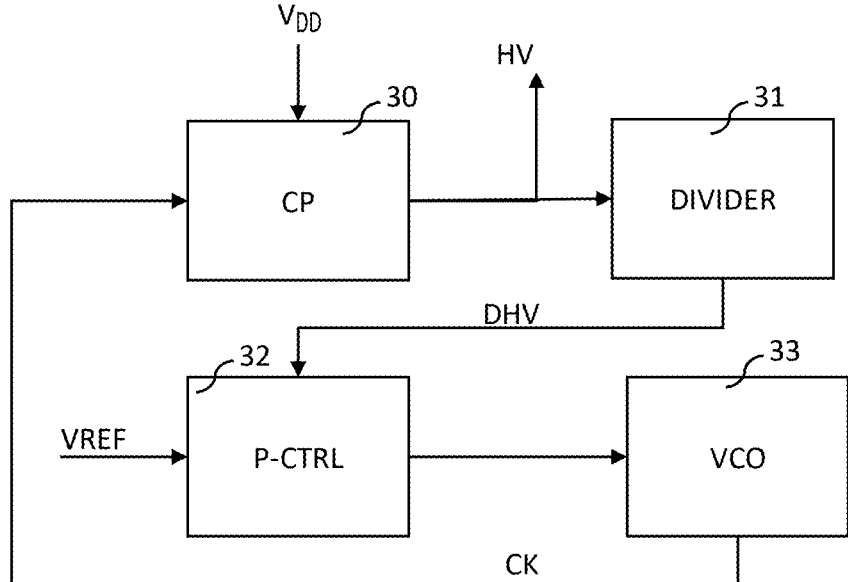
FIG. 1 illustrates an exemplary charge pump with a VCO art.
Figure 2:
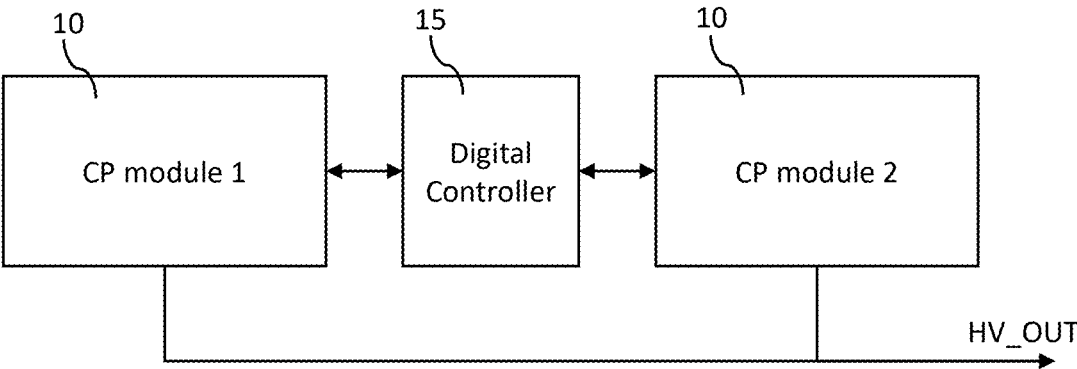
FIG. 2 illustrates a block diagram of an auto-redundant high voltage generating circuitry according to an exemplary aspect.

FIG. 2 illustrates a block diagram of an auto-redundant high voltage generating circuitry according to a first embodiment. The auto-redundant high voltage generating circuitry comprises two mutually similar charge pump modules 10 and a digital controller 15 configured to control operation of the charge pump modules 10 and to select which one of the two charge pump modules 10 is used for providing the high voltage at the high voltage output (HV_OUT). In normal operation, selection and switching between the two charge pump modules 10 is automatic, but for testing purposes, forced, i.e. manual selection of the active charge pump module 10 may be enabled. The high voltage output HV_OUT of the charge pump module 10 that is not currently used for providing the high voltage at HV_OUT is controlled by the digital controller 15 into a high impedance state, in which output of the charge pump module 10 has high impedance thus not loading the active high voltage generating circuitry.

Figure 3:
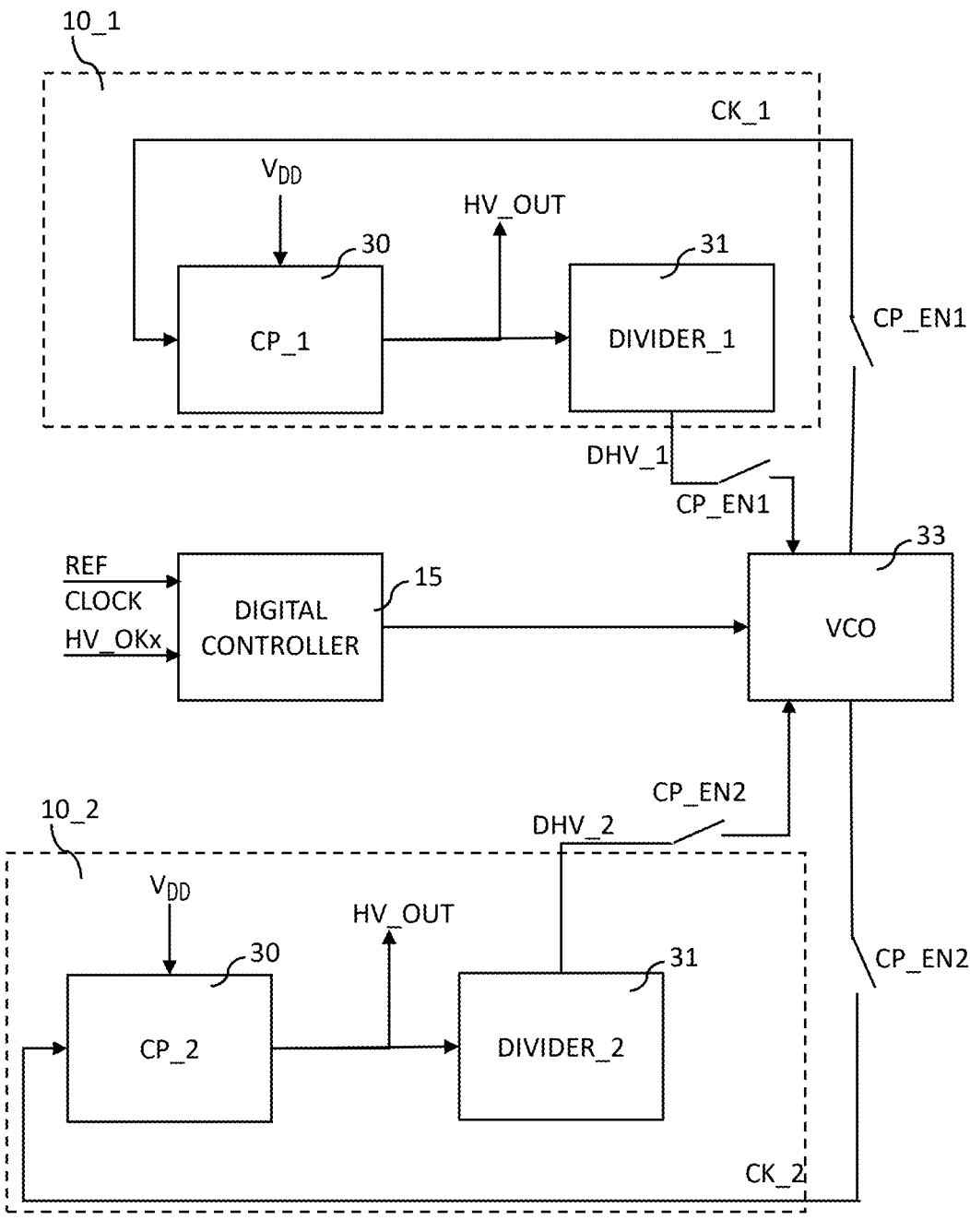
FIG. 3 illustrates a block diagram of an auto-redundant high voltage generating circuitry with a shared low-voltage portion according to an exemplary aspect.

FIG. 3 illustrates a simplified block diagram of an auto-redundant high voltage generating circuitry according to some embodiments. This exemplary embodiment duplicates high-voltage portions and has a common low-voltage portion. The duplicated high-voltage portions comprise all circuitry that handles voltages higher than the supply voltage, referred as charge pump modules 10, each comprising a charge pump 30 and a voltage divider 31. This generalized block diagram omits some control and test signals. The low-voltage portion comprises a digital controller 15 and a clock generating VCO 33, both shared by the two charge pump modules 10, thus not redundant, and additional switches are provided to select one of the charge pump modules 10 to be active at a time. These switches are controlled by charge pump enabling signals provided by the digital controller 15: charge pump enabling signal CP_EN1 enables the first charge pump circuitry 10_1 and charge pump enabling signal CP_EN2 enables the second charge pump circuitry 10_2. One of the divided high voltage signals DHV_1 and DHV_2 is used at a time to control frequency of the VCO 33, which then controls frequency of the respective, currently active charge pump CP_1 or CP_2. In comparison to the controller circuitry of the prior art solution shown in the FIG. 3, the digital controller 15 is further configured to control the switching between the two charge pump modules. This embodiment is applicable if it is acceptable to have no redundancy for the VCO 33. A HV status signal (HV_OKx) for determining whether the currently active charge pump 30 operates as intended may be obtained by comparing the respective divided high voltage signal DHV_1 or DHV_2 to a reference voltage for example by a comparator, and switching to activate the other charge pump 30 is initiated by the digital controller 15 if the HV status signal HV_OKx of the currently enabled and active charge pump indicates that the produced high voltage HV_OUT is not at least equal to a predefined threshold value.

For implementing a controlled switching between the two charge pump modules 10, the digital controller 15 should implement a delay in the exemplary aspect. In this embodiment, clock signal for determining the delay may be received either from the VCO 33 or from an external reference clock source.

Figure 4:
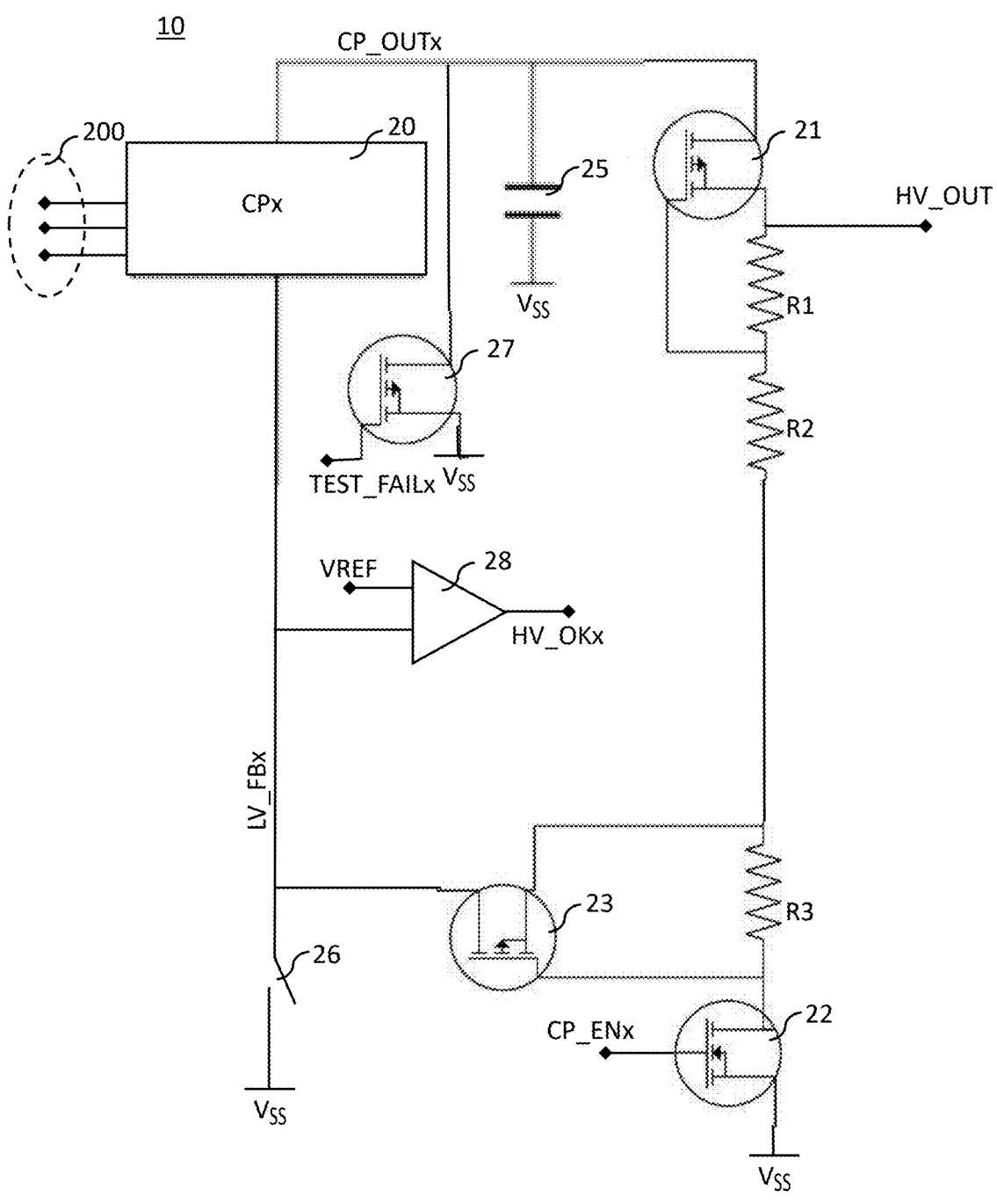
FIG. 4 illustrates a circuit diagram of a charge pump module according to an exemplary aspect.

FIG. 4 illustrates a circuit diagram of a charge pump module 10 according to some embodiments. The charge pump module 10 comprises a charge pump CP 20. The charge pump CP 20 preferably comprises a dedicated voltage-controlled oscillator, VCO, for controlling operation of the charge pump 20, so that operation and output voltage of the charge pump 20 can be easily controlled using a low-voltage feedback signal LV_FBx. The charge pump 20 may be referred also as a charge pump with VCO. In the FIG. 4, letter x is to be replaced with number 1 or 2, depending on the respective one of the two charge pump modules 10. For simplicity, following description omits the x, since just a single charge pump module 10 is shown in the FIG. 4. The two charge pump modules 10 are preferably mutually similar. In comparison to the embodiment shown in the FIG. 3, a difference is that output of the CP's internal VCO should not be used for redundancy control to maintain full redundancy.

The output voltage of the charge pump 20 is referred herein as the charge pump output voltage CP_OUT. When the charge pump module 10 is used for providing the high voltage HV_OUT, the charge pump output voltage CP_OUT is coupled to the high voltage output HV_OUT via a high voltage output switch 21. In the preferred embodiment, the output switch 21 is a P-channel metal oxide field effect transistor, MOSFET, in short PMOS, which particularly suitable to be used as switching component with high voltages, and a PMOS is in practice preferable also because the HV_OUT is the highest voltage available in the circuit, so that an enhancement mode NMOS is not applicable.

The charge pump 20 is provided with a plurality of input signals, such as a supply voltage(s), a reference voltage for controlling operation of the VCO. Control signals optionally further comprise further control signals, such as trimming signals for adjusting a voltage division by an adjustable resistor divider, and/or test control signals to control testing of the charge pump 20. By implementing adjustable voltage division by an adjustable resistive divider, the generated charge pump output voltage CP_OUT and the high voltage HV_OUT can be determined and adjusted.

Using the high voltage output switch 21, state of the output of the high voltage module 10 is controlled. When the charge pump module 10 is active, the high voltage output switch 21 is biased to couple the charge pump output voltage output CP_OUT into the high voltage output HV_OUT. When the charge pump module 10 is disabled, in other words not used for providing the high voltage HV_OUT, the high voltage output switch 21 allows the high voltage output to be put into a high impedance state.

An isolation switch 22 further improves isolation of a disabled charge pump module 10, ensuring that no current is flowing to or from the disabled high voltage output HV_OUT. The isolation switch 22 also makes the operation of high voltage output switch 21 possible as the high voltage output switch 21 can only be turned off when both terminals of resistor R1 are at voltage HV_OUT. Thus, charge pump output voltage CP_OUT can be dropped to 0V even if the high voltage node HV_OUT is at the required level, fed by output of the other charge pump module 10 when active, because the charge pump 20 is fully isolated from the high voltage output HV_OUT.

A charge pump filter capacitor 25 can be provided to filter the ripple caused by the switched charge pump operation. The bigger the capacitance of the charge pump filter capacitor 25, the smaller the ripple, but increasing the capacitance also increases the rise time of the charge pump's output voltage CP_OUT to arrive to the desired high voltage value. When the charge pump operates in closed loop configuration as in this embodiment, the charge pump filter capacitor 25 determines the dominating pole frequency in the loop.

A resistive divider comprising resistors R1, R2 and R3 can be configured to divide the generated high voltage HV_OUT so as to obtain proper gate biasing for switches 21, 22 and 23. The resistive divider produces suitable gate voltage for automatically controlling operation of the high voltage output switch 21 and a high voltage-low voltage (HV-LV) isolation switch 23. The resistive divider is also used for adjusting voltage level of the low-voltage feedback signal LV_FB to an appropriate level to be fed back to the charge pump CP 20 so that it can be compared to a reference voltage in the CP 20 for controlling operation of the VCO of the CP 10.

In this example, a HV-LV isolation switch 23 is also a PMOS. This switch enables coupling a low-voltage feedback signal towards the charge pump 20 to control operation of the VCO for controlling the charge pump output voltage CP_OUT and the high voltage HV_OUT, while enabling isolation of the high voltage portion of the charge pump module's circuitry from the low-voltage portion when the charge pump module 10 is disabled and the high voltage in HV_OUT is produced from the other charge pump module. Gate voltage for controlling the HV-LV isolation switch 23 is determined by the resistive divider when the high voltage output switch 21 and the isolation switch 22 are conducting when the charge pump module 10 is active. When the isolation switch 22 is conducting, gate of the HV-LV isolation switch 23 is grounded and the divided high voltage is provided as the low-voltage feedback signal LV_FB. When the isolation switch 22 is not conducting, both nodes of the R3 resistor have HV_OUT voltage, and the HV-LV isolation switch 23 is not conducting; no low-voltage feedback signal LV_FB is available to the charge pump 20.

When the charge pump module 10 is disabled, disabling of the charge pump 20 and isolation of the high voltage output HV_OUT may further be ensured by a CP grounding switch 26, which forces the low-voltage feedback signal LV_FB to ground when the charge pump module is disabled. Since the CP grounding switch 26 is at the low-voltage side of the circuitry, it may be implemented as any suitable type of transistor.

According to an exemplary aspect, operation of the charge pump module 10 is enabled by activating the isolation switch 22, implemented using a N-channel metal oxide field effect transistor, MOSFET, in short NMOS. A low voltage control signal, such as the charge pump enabling signal CP_EN from the digital controller, can be used to control the gate of the isolation switch 22, since the NMOS is against ground $V_{SS}$. Enabling the isolation switch 22 enables the two PMOS switches, namely the high voltage output switch 21 and the HV-LV isolation switch 23, which allows the voltage in the high voltage output HV_OUT to start to increase by enabling operation of the resistive divider.

As known in the art, increasing the output voltage occurs with a delay after enabling the isolation switch 22. This configuration enables the control loop of the charge pump 20, and its output voltage CP_OUT and thus also the high voltage output HV_OUT rises until it achieves the desired high voltage value determined by the reference voltage VREF. A delay is implemented in the digital controller such that the generated high voltage HV_OUT is only provided in the output of the circuitry after the desired high voltage has been reached. This delay should be long enough to cover all delays that can be considered to be "normal", despite differences in delays caused for example by normal variations caused by manufacturing processes, temperatures, and acceptable tolerance ranges of input voltage(s).

According to some embodiments, the charge pump module 10 further comprises test circuitry for testing proper operation of the charge pump module 10 and/or for testing proper operation of a switching logic that causes switching that automatically activates the other one of the two high voltage generating circuits.

Continuous control of the active charge pump module 10 can be implemented using a comparator 28 that compares the resistor-divided low-voltage feedback voltage LV_FB to a reference voltage VREF, and result of this comparison is provided as a HV status signal HV_OK to the digital controller. As long as the LV_FB is equal or above the reference voltage, HV status signal HV_OK indicates that the charge pump module 10 operates as intended. This comparison is performed continuously during normal auto-redundancy operation for supervising proper operation of the active charge pump module 10. The same comparator 28 can also be used for testing purposes.

The charge pump module 10 may further comprise another test arrangement, namely a test-failure switch 27 configured to force output of the active charge pump 20 to ground. By forcing the output of the active charge pump 20 to ground, this should cause the digital controller to automatically switch between the two charge pump modules 10, in other words disabling the previously active charge pump module 10 that is deliberately forced to "failure" by the grounding by the test-failure switch 27 and activating the other charge pump module 10 instead.

According to some embodiments, the two charge pump modules 10 may have shared clock generation circuitry to save chip area. Such shared clock generation circuitry may comprise for example the VCO and optionally control thereof. This kind of solution is applicable if it is acceptable to not duplicate the respective low voltage portions of the circuitry. For the desired technical benefits of the exemplary aspects of this disclosure, all high voltage capacitors are preferably redundant. In other words, each charge pump module 10 has its own high voltage capacitors, including the charge pump's internal capacitors and the charge pump filtering capacitor 25.

According to some embodiments, the digital controller 15 may be allowed to activate both charge pump modules 10 simultaneously to increase drive current and thus drive capacity of the high voltage generating circuitry. Such special increased capacity mode does not have the benefit for redundancy and increased reliability but may be useful in some circumstances.

Figure 5:
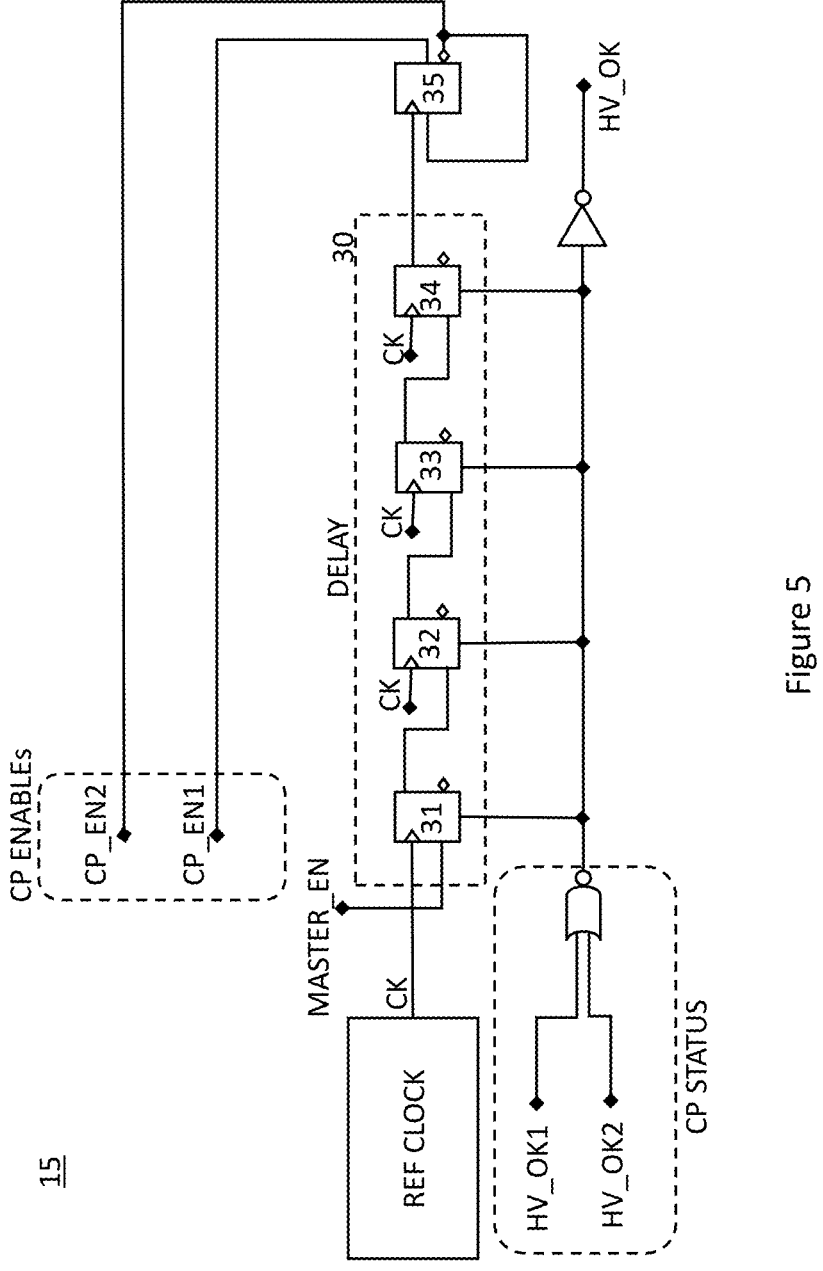
FIG. 5 illustrates a circuit diagram of a digital controller according to an exemplary aspect.

FIG. 5 illustrates a circuitry diagram of a digital controller 20 according to some embodiments. This circuitry enables auto-redundancy but lacks some testing functionality.

Most important inputs are the two charge pump module status signals (CP STATUS), herein represented for as two binary values HV_OK1 and HV_OK2, and a reference clock (REF CLOCK) or other means to create a fixed delay with a delay chain 38. The CP STATUS signals may be received from the comparator 28. Most important outputs are the enabling control signals for the two charge pumps (CP ENABLEs) named herein as CP_EN1 and CP_EN2, which may be used to enable and disable the isolation switch 22 as well as to disable and enable the CP grounding switch 26, if comprised in the charge pump modules. It is noted that polarity of control of the isolation switch 22 and the CP grounding switch 26 are mutually opposite.

During power-up, one of the enabling control signals, e.g. CP_EN1 is high, but both HV status signals HV_OK1 and HV_OK2 are low. This result indicates that the delay chain 38, implemented herein as a clock counter, is started. The clock counter is just one example of an applicable configuration for implementing a predetermined delay, and other equivalent configurations for implementing the delay are applicable. The delay must be designed so that a functional charge pump and charge pump module always starts faster than the counter delay. This way delay flipflops 31, 32, 33, 34 of the delay chain will be reset due to the HV_OK1 or HV_OK2 signal becoming high after the appropriate high voltage level has been reached, and the last flipflop will never receive new clock edge, when the currently active charge pump module and its charge pump operates properly, and the originally selected charge pump module will continue to operate as long as it generates the high voltage at the HV_OUT output as intended. But if the initially started charge pump module 10 will never start or does not reach the desired high voltage value, the respective HV_OK will remain low, the last delay flipflop 34 will toggle and the other charge pump module will be enabled instead by the other enabling control signal. The delay counter starts again, and as long as the newly activated charge pump module is functional, and the last flipflop 34 in the delay chain 38 will not chance the enabling control signal because the delay chain 38 is reset with the respective rising CP STATUS signal HV_OK.

Figure 6:
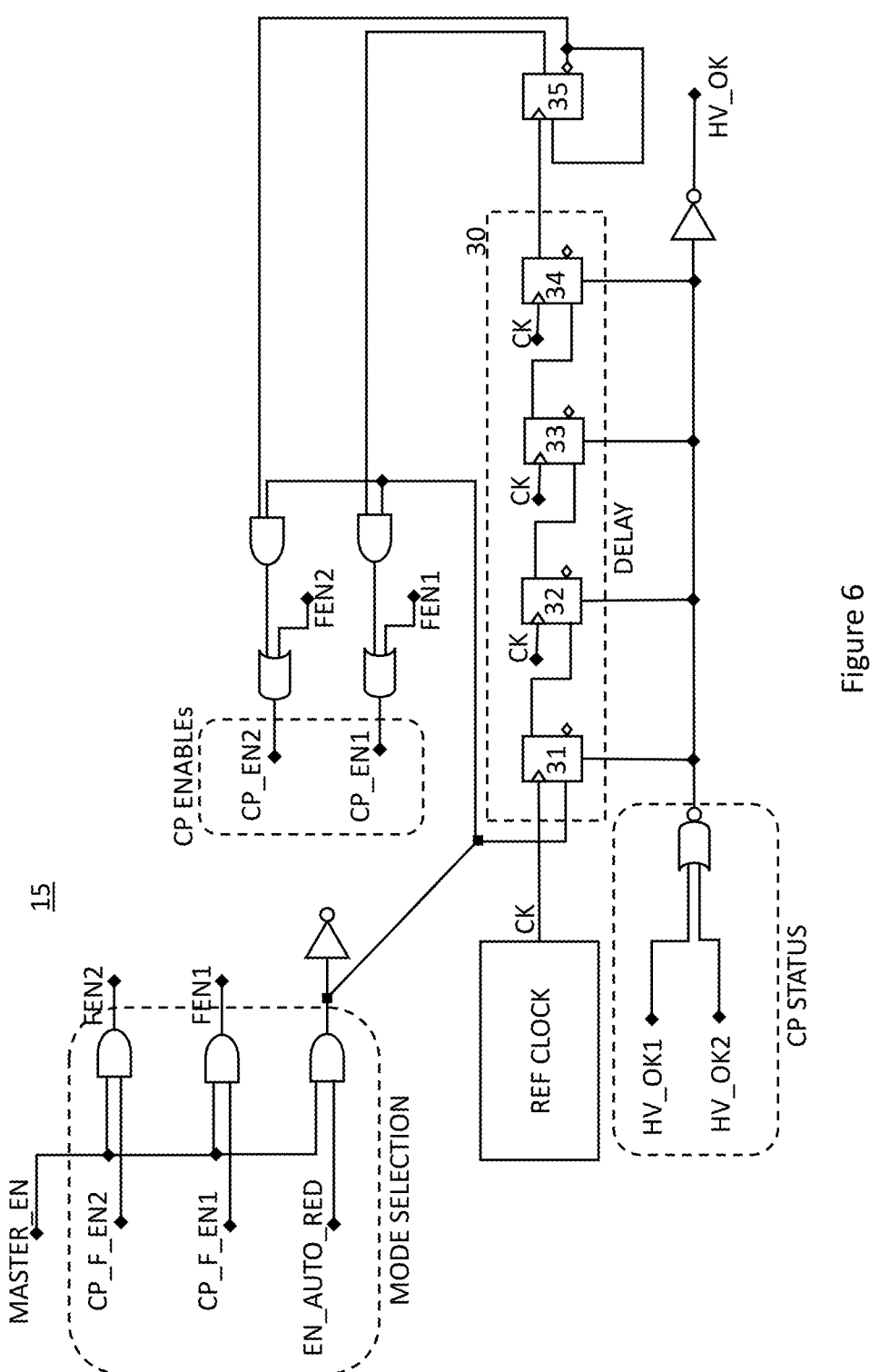
FIG. 6 illustrates a circuit diagram of a digital controller according to an exemplary aspect.

FIG. 6 illustrates a circuitry diagram of a digital controller 20 according to some exemplary embodiments, with further controls for controlling testing of functionality of the charge pump modules 10 as well as for testing proper operation of the digital controller itself, in particular testing of the switching logic and delay. Especially when testing an ASIC, it is important to test that both charge pump modules and charge pumps are functional.

Auto redundance enable signal EN_AUTO_RED allows the above-described automatic shift control functionality to automatically switch between the two charge pump modules when the active module is determined not to be functional, in other words when the respective HV_OK1 or HV_OK2 signal indicates a failure of the active charge pump module. Force enabling CP control signals CP_F_EN1 and CP_F_EN2 can be used to force one of the charge pump modules 10 to be active for testing purposes, by setting the respective force-enable signal FEN1 or FEN2 high, thus causing ignoring of the output signal from the delay chain 38. During this testing, the HV_OK signal can be used as a digital indicator for whether the currently active charge pump module 10 provides the desired high voltage HV_OUT, and, of course, the actual high voltage output signal HV_OUT can be measured as well. Also, the supply current may be one possible parameter to be measured during verification that both pumps function properly. Further, VCO frequency is a viable measure of CP functional correctness.

Operation of the automatic shift control functionality can be tested with the test-failure switches 27 provided in the charge pump modules 10. For this testing, the automatic redundancy switching mode is enabled by enabling the EN_AUTO_RED control signal. After one of the charge pump modules 10 is in operation, indicated by the HV_OK signal, the respective test-failure switch 27 is enabled so that output CP_OUT of the respective, active charge pump 20 is forced to ground. This should cause the automatic shifting to occur, activating the other charge pump module 10 after the delay determined by the delay chain 38. The same test is preferably performed for both charge pump modules 10. Only when both pumps are tested ok, the auto-redundancy can be deemed functional.

The reference clock input CK to the delay chain can be a clock received from the charge pump, but then it is important to understand that the redundancy does not include clock generation. Alternatively, the reference clock input CK for the delay chain may be from a dedicated REF CLOCK source, in which case the clock generation within each charge pump module 10 is included in the redundant functionalities of the apparatus.

In general, it is noted that the exemplary embodiments described above are intended to facilitate the understanding of the exemplary aspects of the present disclosure and are not intended to limit the interpretation of the present disclosure. The exemplary aspects of the present disclosure may be modified and/or improved without departing from the spirit and scope thereof, and equivalents thereof are also included in the present invention. That is, exemplary embodiments obtained by those skilled in the art applying design change as appropriate on the embodiments are also included in the scope of the present invention as long as the obtained embodiments have the features of the present invention. For example, each of the elements included in each of the embodiments, and arrangement, materials, conditions, shapes, sizes, and the like thereof are not limited to those exemplified above and may be modified as appropriate. It is to be understood that the exemplary embodiments are merely illustrative, partial substitutions or combinations of the configurations described in the different embodiments are possible to be made, and configurations obtained by such substitutions or combinations are also included in the scope of the present invention as long as they have the features of the present invention.

What is claimed:

1. An auto-redundant high voltage generating circuitry for generating a high voltage to a low DC current load, the auto-redundant high voltage generating circuitry comprises:

two charge pump modules that each include a charge pump, with the high voltage configured to be generated by having one of the two charge pump modules active at a time while the other of the two charge pump module is inactive, each charge pump module being configured to provide:

the high voltage to a high voltage output coupled to both of the two charge pump modules when the charge pump module is active, and a status information signal that indicates whether the active charge pump module is functional; and a digital controller configured to:

monitor the status information signal of the charge pump module that is active, and automatically switch to the other charge pump module to generate the high voltage when the status information signal indicates that the active charge pump module that is active is not functional, wherein each charge pump module comprises a high voltage output switch that is coupled between an output of the charge pump and the high voltage output of the respective charge pump module, wherein a gate of the high voltage output switch is coupled to the high voltage output via a resistor divider, and wherein the high voltage output switch is configured to cause the respective charge pump module to configure the high voltage output in a high impedance state when the charge pump of the respective charge pump module is inactive.

2. The auto-redundant high voltage generating circuitry according to claim 1, wherein the high voltage output switch of each charge pump module is a PMOS.

3. The auto-redundant high voltage generating circuitry according to claim 1, wherein the status information signal that indicates whether the active charge pump module is functional is based on comparing a divided voltage to a reference voltage, and the divided voltage is generated by dividing the high voltage at the high voltage output of the charge pump module with a resistive divider.

4. The auto-redundant high voltage generating circuitry according to claim 1, wherein the digital controller comprises a delay chain configured to delay automatic switching of the output voltage of the charge pump of a newly activated charge pump module to the high voltage output of the high voltage generating circuitry for a delay period, such that the output voltage of the newly activated charge pump is enabled to reach a predetermined high voltage value before the automatic switching.

5. The auto-redundant high voltage generating circuitry according to claim 1, wherein each charge pump module comprises a dedicated voltage-controlled oscillator configured to generate clock signals for operating the charge pump of the respective charge pump module.

6. The auto-redundant high voltage generating circuitry according to claim 1, further comprising a single voltage-controlled oscillator configured to generate clock signals for operating one charge pump of the two charge pump modules at a time.

7. The auto-redundant high voltage generating circuitry according to claim 4, further comprising a single voltage-controlled oscillator configured to generate clock signals for operating one charge pump of the two charge pump modules at a time, and wherein a reference clock signal for the delay chain is generated by the voltage-controlled oscillator.

8. The auto-redundant high voltage generating circuitry according to claim 4, wherein a reference clock signal for the delay chain is received from an external reference clock generation circuitry.

9. The auto-redundant high voltage generating circuitry according to claim 1, wherein the digital controller is configured to test a proper operation of each individual charge pump module by:

disabling auto-redundancy between the two charge pump modules, forcing one of the two charge pump modules to be active, and determining whether the high voltage received from the active charge pump module is in predetermined level by comparing a divided voltage to a reference voltage, wherein the divided voltage is generated by dividing the high voltage at the high voltage output of the charge pump module with a resistive divider.

10. The auto-redundant charge pump circuitry according to claim 1, wherein the digital controller is configured to test a proper operation of a switching logic of the digital controller by:

forcing an output of a charge pump of a first one of the two charge pump modules to a failure condition by causing the output of the charge pump comprised in the active charge pump module to be short circuited to ground, and detecting whether the second charge pump module of the two charge pump modules activates within a predetermined delay after the output of the charge pump of the first one of the two charge pump modules was forced to the failure condition.

11. A method for generating a high voltage to a low DC current load by an auto-redundant charge pump circuitry comprising a digital controller and two charge pump modules that each include a charge pump, by generating the high voltage by an active charge pump module, while the other of the two charge pump module is inactive, the method comprising:

providing, by the active charge pump module, a high voltage in a high voltage output coupled to both of the two charge pump modules;

providing, by the active charge pump module, a status information signal that indicates whether the active charge pump module is functional;

monitoring, by the digital controller, the status information signal of the active charge pump module;

automatically switching the other charge pump module to produce the high voltage when the status information signal indicates that the currently active charge pump module is not functional; and setting a high voltage output of a charge pump module in a high impedance state when the respective charge pump module is inactive by a high voltage output switch coupled between an output of the charge pump and the high voltage output of the respective charge pump module, wherein a gate of the high voltage output switch is coupled to the high voltage output via a resistor divider.

12. The method according to claim 11, wherein the high voltage output switch is a PMOS.

13. The method according to claim 11, further comprising determining the status information signal that indicates whether the active charge pump module is functional based on comparing a divided voltage to a reference voltage, the divided voltage being generated by dividing the high voltage at the high voltage output of the charge pump module with a resistive divider.

14. The auto-redundant high voltage generating circuitry according to claim 11, further comprising delaying an automatic switching of the output voltage of the charge pump of a newly activated charge pump module to the high voltage output of the high voltage generating circuitry for a delay period to enable the output voltage of the newly activated charge pump to reach a predetermined high voltage value before the automatic switching.

15. The method according to claim 11, further comprising generating a clock signal for operating the charge pump of the respective charge pump module by a dedicated voltage-controlled oscillator comprised in the respective charge pump module.

16. The method according to claim 11, further comprising generating a clock signal for operating one charge pump of the two charge pump modules at a time by a single, shared voltage-controlled oscillator.

17. The method according to claim 13, further comprising:

generating a clock signal for operating one charge pump of the two charge pump modules at a time by a single, shared voltage-controlled oscillator; and generating a reference clock signal for determining an amount of the delaying of the automatic switching by the shared voltage-controlled oscillator.

18. The method according to claim 14, further comprising receiving a reference clock signal for determining an amount of delaying of the automatic switching from an external reference clock generation circuitry.

19. The method according to claim 11, further comprising testing a proper operation of each individual charge pump module by:

disabling an auto-redundancy between the two charge pump modules;

forcing one of the two charge pump modules to be active; and determining whether the high voltage received from the active charge pump module is in predetermined level by comparing a divided voltage to a reference voltage, wherein the divided voltage is generated by dividing the high voltage at the high voltage output of the charge pump module with a resistive divider.

20. The method according to claim 11, further comprising testing a proper operation of a switching logic by:

forcing the output of a charge pump of a first one of the two charge pump modules to a failure condition by causing an output of the charge pump comprised in the active charge pump module to be short circuited to ground, and detecting whether the second charge pump module of the two charge pump modules activates within a predetermined delay after the output of the charge pump of the first one of the two charge pump modules was forced to the failure condition.

* * * * *